United States Patent
Yang et al.

(10) Patent No.: US 12,245,411 B2
(45) Date of Patent: Mar. 4, 2025

(54) CIRCUIT BOARD TO WHICH 3D FORMED ELECTROMAGNETIC SHIELDING FILM IS ATTACHED, 3D FORMABLE ELECTROMAGNETIC SHIELDING FILM, AND 3D FORMED ELECTROMAGNETIC SHIELDING FILM

(71) Applicant: 3M INNOVATIVE PROPERTIES COMPANY, St. Paul, MN (US)

(72) Inventors: Chao Yang, Shanghai (CN); Yuan Zhao, Shanghai (CN); Zhiyong Xu, Shanghai (CN); Ju Le Sun, Shanghai (CN)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 18/265,597

(22) PCT Filed: Nov. 23, 2021

(86) PCT No.: PCT/IB2021/060881
§ 371 (c)(1),
(2) Date: Jun. 6, 2023

(87) PCT Pub. No.: WO2022/136973
PCT Pub. Date: Jun. 30, 2022

(65) Prior Publication Data
US 2024/0040760 A1    Feb. 1, 2024

(30) Foreign Application Priority Data
Dec. 21, 2020  (CN) .......................... 202011523926.0

(51) Int. Cl.
*H05K 9/00* (2006.01)
*H05K 1/02* (2006.01)
*H05K 3/24* (2006.01)

(52) U.S. Cl.
CPC ......... *H05K 9/0084* (2013.01); *H05K 1/0216* (2013.01); *H05K 3/241* (2013.01); *H05K 2201/0707* (2013.01)

(58) Field of Classification Search
CPC ...................................................... H05K 9/009
See application file for complete search history.

(56) References Cited

U.S. PATENT DOCUMENTS

| | | | | |
|---|---|---|---|---|
| 6,090,728 A | * | 7/2000 | Yenni, Jr. ............. | H05K 9/0028 442/16 |
| 6,197,408 B1 | | 3/2001 | Kanbara et al. | |

(Continued)

FOREIGN PATENT DOCUMENTS

| | | |
|---|---|---|
| CN | 110691499 A | 1/2020 |
| CN | 110769666 A | 2/2020 |

(Continued)

OTHER PUBLICATIONS

International Search report for PCT International Application No. PCT/IB2021/060881, mailed on Mar. 2, 2022, 3 pages.
Extended European Search Report for European Application No. 21909644.3, mailed Jan. 22, 2025, 13 pp.

*Primary Examiner* — Hung V Ngo
(74) *Attorney, Agent, or Firm* — Robert S. Moshrefzadeh

(57) ABSTRACT

The present invention relates to a circuit board to which a 3D formed electromagnetic shielding film is attached, a 3D formable electromagnetic shielding film, a 3D formed electromagnetic shielding film, and a method for attaching an electromagnetic shielding film to a circuit board. The circuit board includes an electronic component. The 3D formed electromagnetic shielding film includes a molding layer, a shielding layer, and an adhesive film. The molding layer and the adhesive film are laminated. The shielding layer is a conductive non-woven layer embedded in the adhesive film. A ratio of a surface area $S_2$ of the electromagnetic shielding film after forming with an upper surface area of the electronic component deducted to a surface area $S_1$ thereof before forming with the upper surface area of the electronic component deducted is 1.5 to 17. The electromagnetic shielding film is attached to the electronic component of a system-in-package module by means of a 3D formation process, and has good electromagnetic shielding performance. The circuit board to which the 3D formed electromagnetic shielding film is attached is suitable for a wave (Continued)

soldering process or a reflow soldering process in a subsequent manufacturing procedure, and the reflow soldering process does not cause any damage to the electromagnetic shielding film.

4 Claims, 2 Drawing Sheets

(56) References Cited

U.S. PATENT DOCUMENTS

| | | |
|---|---|---|
| 2010/0214713 A1 | 8/2010 | Song |
| 2017/0318713 A1 | 11/2017 | Bang et al. |
| 2020/0084924 A1 | 3/2020 | Hong |

FOREIGN PATENT DOCUMENTS

| | | |
|---|---|---|
| CN | 110876256 A | 3/2020 |
| CN | 110199584 B | 3/2021 |
| CN | 111556703 B | 4/2021 |
| JP | 2017155682 A | 9/2017 |
| JP | 2018142190 A | 9/2018 |
| JP | 2018195854 A | 12/2018 |
| JP | 6451801 B1 | 1/2019 |
| JP | 2019102628 A | 6/2019 |
| JP | 6597927 B1 | 10/2019 |
| JP | 2020107840 A | 7/2020 |
| WO | 2011143144 A2 | 11/2011 |
| WO | 2018147355 A1 | 8/2018 |
| WO | 2019035697 A1 | 2/2019 |

* cited by examiner

CIRCUIT BOARD TO WHICH 3D FORMED ELECTROMAGNETIC SHIELDING FILM IS ATTACHED, 3D FORMABLE ELECTROMAGNETIC SHIELDING FILM, AND 3D FORMED ELECTROMAGNETIC SHIELDING FILM

CROSS REFERENCE TO RELATED APPLICATIONS

This application is a national stage filing under 35 U.S.C. 371 of PCT/IB2021/060881, filed Nov. 23, 2021, which claims the benefit of China Application No. 202011523926.0, filed Dec. 21, 2020, the disclosures of which are incorporated by reference in their entireties herein.

TECHNICAL FIELD

The present invention relates to the technical field of electromagnetic shielding films. Specifically, the present invention provides a circuit board to which a 3D formed electromagnetic shielding film is attached, a 3D formable electromagnetic shielding film, and a 3D formed electromagnetic shielding film, applicable to a system-in-package (SIP) module.

BACKGROUND

An electronic element, especially an electronic component, is relatively sensitive to electromagnetic interference (EMI). The EMI comes from various sources, and may also come from an electronic apparatus itself. EMI generated between different devices on an integrated circuit board may often affect operation stability of an electronic element, and in a severe case may result in a failure of the device. When a main circuit has a relatively small size, and a distance between the elements is short, and when the electronic apparatus operates at a higher frequency, the electromagnetic interference becomes more obvious. In order to ensure that the electronic apparatus operates normally, unnecessary electromagnetic interference needs to be shielded.

As the design size of an electronic device becomes smaller and more electronic components and elements are integrated on a printed circuit board, the industry has seen a growing trend towards integrating one or more electronic components and passive elements into one packaging system, i.e. system-in-package (SIP). Compared with a conventional packaging process, electromagnetic shielding of device-level packaging can be for the entire device, and can also be individually for each independent assembly in the device. As the device becomes miniaturized and the process becomes highly integrated, electromagnetic shielding for system-in-package has always been a research focus.

However, the spacing between SIP elements in a packaging stage is very narrow. The SIP element is generally a rectangular or a square having a side length of 1000-50000 µm. Generally, a distance between two SIP elements is 200-1000 µm, and a depth is 400-1600 µm. Regarding electromagnetic shielding for this element, a continuous and effective conductive layer needs to be formed on an outermost layer of the device. The conductive layer is connected to a ground wire of the circuit board to form a Faraday cage so as to achieve a shielding effect. A ground point of the SIP device is often at a lower ⅓ position of the height of the device, i.e., on a multi-layered circuit board. Therefore, an electromagnetic shielding layer needs to be effectively connected to the multi-layered circuit board.

Electromagnetic shielding for system-in-package (SIP) generally uses magnetron sputtering, spraying, electroplating/electroless plating, etc. It is also reported that the electromagnetic shielding for SIP uses a 3D formed conductive adhesive (WO 2018147355). Various methods all use the following as main technical indicators: effective coverage of the conductive layer is achieved, interconnection to the conductive layer is achieved, and the circuit board is well grounded. The magnetron sputtering process is high in costs, and is complicated. The spraying process has low efficiency and a high defect rate. Electroplating/electroless plating causes serious environmental pollution, and a plating layer lacks effective protection.

In summary, currently, there is a huge demand for an electromagnetic shielding film that has good plasticity, is 3D formable, and is suitable for a lead-free reflow soldering process. Therefore, it is of great significance to develop an electromagnetic shielding film that is 3D formable, is suitable for a lead-free reflow soldering process after having been subjected to the 3D formation, and has good electromagnetic shielding performance.

SUMMARY

On the basis of the technical problems described above, the objective of the present invention is to provide a circuit board to which a 3D formed electromagnetic shielding film is attached and a 3D formable electromagnetic shielding film for a circuit board. By being subjected to thermoforming, the electromagnetic shielding film for a system-in-package circuit board according to the technical solution of the present invention is prone to have good electromagnetic shielding performance and good plasticity, and can withstand a reflow soldering process. A molding layer provides good shape conformability during forming, and also adds additional physical protection to a shielding layer, thereby effectively improving the reliability of a device.

The inventors have conducted intensive and detailed research to achieve the present invention.

According to an aspect of the present invention, a circuit board to which a 3D formed electromagnetic shielding film is attached is provided, the circuit board comprising an electronic component, wherein the 3D formed electromagnetic shielding film comprises a molding layer, a shielding layer, and an adhesive film; the molding layer and the adhesive film are laminated; the shielding layer is a conductive non-woven layer embedded in the adhesive film, wherein a ratio of a surface area $S_2$ of the electromagnetic shielding film after forming with an upper surface area of the electronic component deducted to a surface area $S_1$ thereof before forming with the upper surface area of the electronic component deducted is 1.5 to 17, and the electromagnetic shielding film has a surface resistance of less than or equal to 10Ω and a loss factor value (i.e., a damping value) tan δ of less than or equal to 0.2 in the temperature range of 180-250° C.

A formula for calculating the ratio of the surface area $S_2$ of the electromagnetic shielding film after forming with the upper surface area $(l_1*l_2/S2(l_1*l_2)$ of the electronic component deducted to a surface area $S_1$ thereof before forming with the upper surface area (equation) of the electronic component deducted is as follows:

$$\frac{S_2}{S_1} = \frac{(l_1+d_1)(l_2+d_2) - l_1 l_2 + h(2l_1 + 2l_2)}{(l_1+d_1)(l_2+d_2) - l_1 l_2}$$

where, $l_1$ is the side length of the electronic component in the x-axis direction; $l_2$ is the side length of the electronic component in the y-axis direction; $d_1$ is the width of a slit between the two electronic components in the x-axis direction; $d_2$ is the width of the slit between the two electronic components in the y-axis direction; h is the height of the electronic component in the z direction. (Reference may be made to FIG. 3) When the electronic component has an irregular shape, the area of the electromagnetic shielding film before forming, the upper surface area of the electronic component, and a side surface area of the electronic component are all replaced with areas actually measured by a laser-based 3D scanning.

According to another aspect of the present invention, a 3D formable electromagnetic shielding film is provided, comprising a thermoplastic layer, a shielding layer, and an adhesive film, wherein the thermoplastic layer and the adhesive film are laminated, and the shielding layer is a conductive non-woven layer partially embedded in the adhesive film, wherein the 3D formable electromagnetic shielding film has a loss factor value (i.e., a damping value) tan δ of greater than or equal to 0.5 at at least one temperature point in the temperature range of 50-200° C.

According to yet another aspect of the present invention, a 3D formed electromagnetic shielding film is provided, wherein the electromagnetic shielding film comprises any one of the 3D formed electromagnetic shielding films provided by the present invention.

According to still another aspect of the invention, a method for attaching an electromagnetic shielding film to a circuit board is provided, comprising attaching any of the 3D formable electromagnetic shielding films of the present invention to a circuit board and performing 3D formation. After having been subjected to the 3D formation, the 3D formable electromagnetic shielding film comprises a molding layer, a shielding layer, and an adhesive film; the molding layer and the adhesive film are laminated; the shielding layer is a conductive non-woven layer embedded in the adhesive film, wherein a ratio of a surface area $S_2$ of the electromagnetic shielding film after forming with an upper surface area of an electronic component deducted to a surface area $S_1$ thereof before forming with the upper surface area of the electronic component deducted is 1.5 to 17, and the electromagnetic shielding film has a surface resistance of less than or equal to 10Ω and a loss factor value (i.e., a damping value) tan δ of less than or equal to 0.2 in the temperature range of 180-250° C.

BRIEF DESCRIPTION OF THE DRAWINGS

The accompanying drawings, which are incorporated herein and constitute part of this specification, illustrate exemplary embodiments of the present invention, and, together with the general description provided above and the detailed description provided below, serve to explain the features of the present invention.

DETAILED DESCRIPTION

Figure 1:
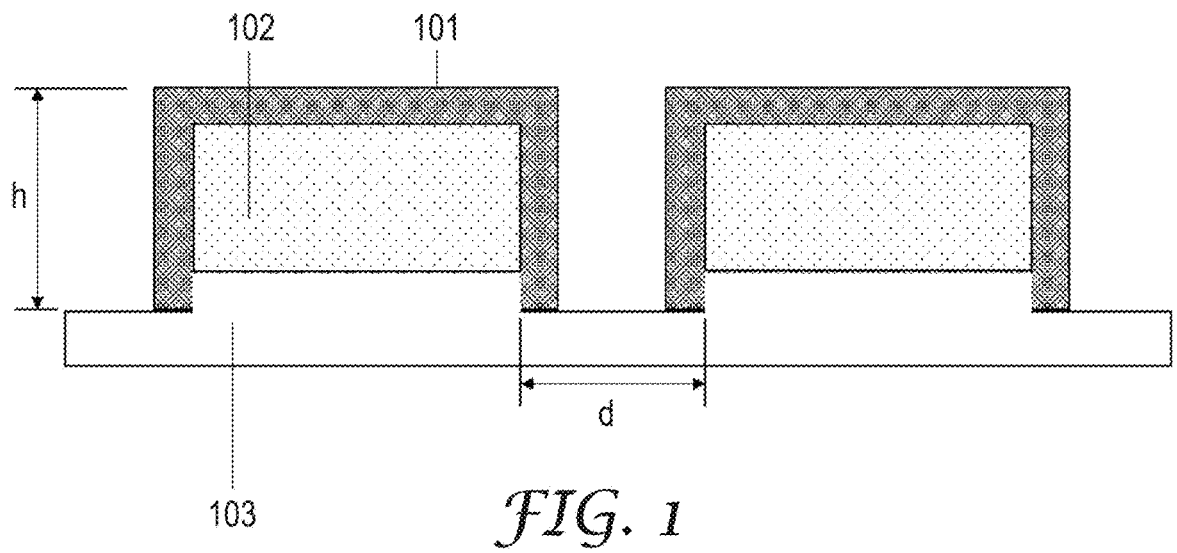
FIG. 1 is a schematic cross-sectional view of a 3D formed electromagnetic shielding film formed on a plurality of electronic devices of a system-in-package (SIP) circuit board according to an embodiment of the present invention, where 101 is an electromagnetic shielding film; 102 is an SIP element; 103 is a circuit board.
Figure 2:
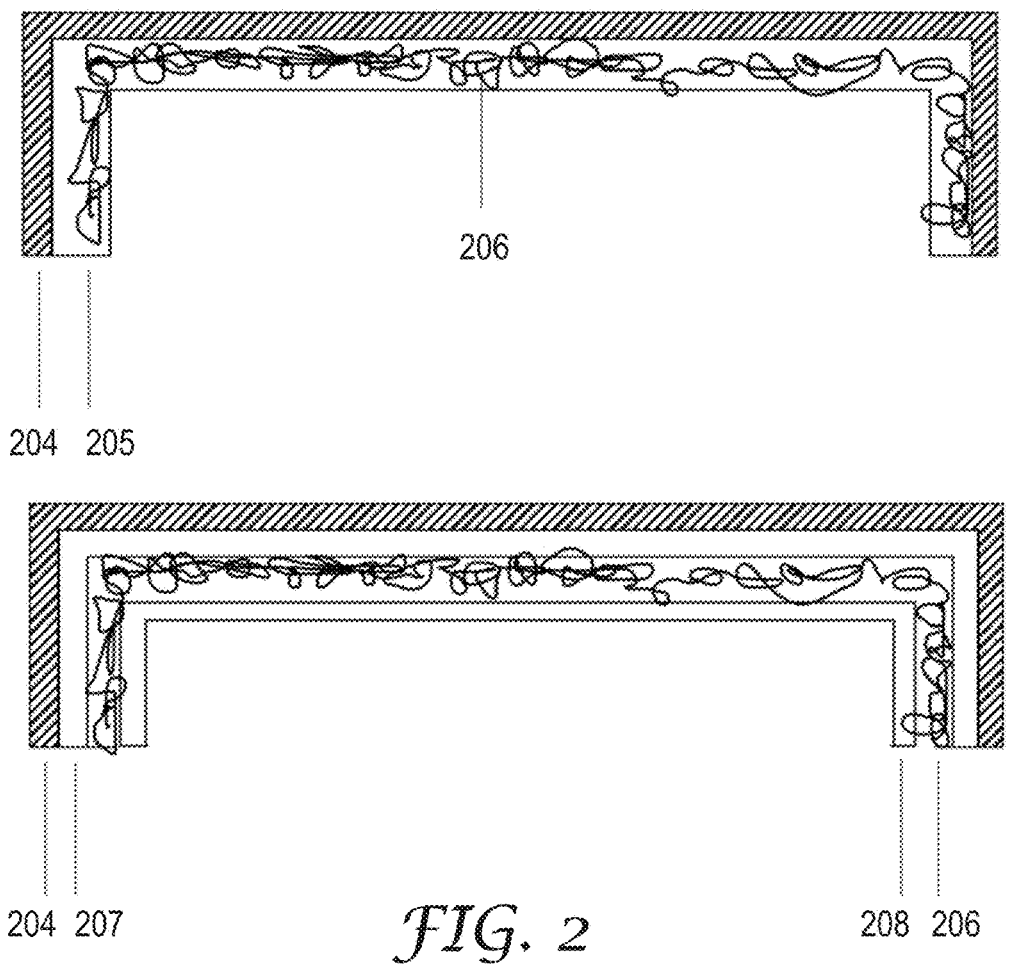
FIG. 2 is a cross-sectional view of a 3D formed electromagnetic shielding film on a single electronic device according to another embodiment of the present invention, where 204 is a molding layer; 205, 207, and 208 are adhesive layers; 206 is a conductive non-woven fabric.

It is to be understood that a person skilled in the art can envisage other various embodiments according to teachings in this description, and can make modifications thereto without departing from the scope or spirit of the present disclosure. Therefore, the following particular embodiments are not restrictive in meaning.

All figures for denoting characteristic dimensions, quantities and physicochemical properties used in this description and claims are to be understood as modified by a term "about" in all situations, unless indicated otherwise. Therefore, unless stated conversely, parameters in numerical values listed in the above description and the claims are all approximate values, and a person skilled in the art is capable of seeking to obtain desired properties by taking advantage of contents of the teachings disclosed herein, and changing these approximate values appropriately. The use of a numerical range represented by end points includes all figures within the range and any range within the range, for example, 1 to 5 includes 1, 1.1, 1.3, 1.5, 2, 2.75, 3, 3.80, 4, 5, etc.

According to the technical solution of the present invention, the term "thermoplasticity" refers to a property that a material can be softened and deformed when heated and can maintain a certain shape after being cooled, wherein the material is subjected to molding or extrusion molding in a softened state.

According to the technical solution of the present invention, the term "thermoplastic plastic" refers to a plastic that is plastic at a certain temperature, is cured after being cooled, and can repeat this procedure. The characteristic of the structure of the molecule is that the molecule is a linear macromolecular compound. Generally, the linear macromolecular compound does not have any active group, and no linear intermolecular crosslinking occurs when heated. Such material can be formed by employing an amorphous plastic. Crystallization of the material is induced at high temperatures, and cooling and shaping are performed to improve molding performance of the material.

According to the technical solution of the present invention, the term "thermosetting plastic" is also referred to as a thermohardening plastic. Before formation, the thermosetting plastic and the thermoplastic plastic both have a chain structure. During formation, the thermosetting plastic reacts in the form of thermal or chemical polymerization to form a crosslinked structure. Once the reaction is complete, polymer molecule bonds form a three-dimensional network structure, and these crosslinked bonds prevent sliding between molecular chains. As a result, the thermosetting plastic becomes an infusible and insoluble solid.

According to the technical solution of the present invention, the term "thermoplastic elastomer (TPE)" refers to an elastomer that has rubber elasticity at room temperature and can be plasticized and formed at high temperatures. Such polymer is generally a block copolymer including a hard segment and a soft segment. The soft segment and an uncrystallized hard segment form an amorphous phase, thereby providing elasticity. Part of the hard segment is crystallized to form a crystalline micro-domain, and serves as a physical crosslinking point, thereby providing plasticity.

According to the technical solution of the present invention, the term "thermosetting elastomer (TSE)" refers to a crosslinked thermoplastic elastomer. "Crosslinked thermoplastic elastomer" refers to a chemically crosslinked thermoplastic elastomer formed by subjecting a thermoplastic elastomer used to manufacture a thermoplastic layer to chemical crosslinking or electron beam treatment. The chemical crosslinking treatment causes chemical crosslinking points to be generated in the interior of the thermoplastic elastomer by means of chemical bonding so as to form a crosslinked network structure. Therefore, the crosslinked thermoplastic elastomer no longer has thermoplasticity. That is, the crosslinked thermoplastic elastomer is not a thermoplastic elastomer. The crosslinked elastomer is rubber in the conventional sense, such as hot-vulcanized silicone rubber, hot-vulcanized nitrile butadiene rubber, etc.

According to the technical solution of the present invention, the term "3D formed electromagnetic shielding film" refers to a 3D formed electromagnetic shielding film formed by subjecting, on a circuit board, a 3D formable electromagnetic shielding film to molding such as mold clamping, blowing, vacuum molding, etc.

Molding Layer

In order to meet basic use of the electromagnetic shielding film, the "molding layer" of the electromagnetic shielding film in the present invention may include a molded and shaped product of one or more of a thermoplastic plastic, a thermosetting plastic, a thermoplastic elastomer, and a thermosetting elastomer.

The thermoplastic plastic is preferably made of polycarbonate (such as Lexan series resin from Saudi Basic Industries Corporation (SABIC)), polyetheretherketone (such as APTIV series from Victrex), polyaryletherketone (such as PEAK from Changchun Jida Special Plastic Engineering and Research Co., Ltd.), polyetherimide (such as Ultem series resin from Saudi Basic Industries Corporation (SABIC)), and polyphenylene sulfide (such as Fortron series resin from Polyplastics, Japan). Further, the thermoplastic plastic is preferably an amorphous or low-crystallinity thermoplastic plastic thin film, and during 3D formation, crystallization and heat shaping of the amorphous or low-crystallinity plastic are completed.

The thermosetting plastic includes phenolic resin (such as BRG series resin from AICA, Japan), unsaturated polyester, epoxy resin (such as UPR series resin from Ashland), silicone resin (such as SILRES series resin from Wacker), polyurethane (such as CPU series from Covestro), a thermosetting elastomer such as liquid silicone rubber (such as LIM LSR from Momentive), thermoplastic polyurethane elastomer (such as LARIPUR series from COIM), thermoplastic polyester elastomer (such as TPC-EM series resin from DSM), and thermoplastic vulcanized ester elastomer (such as TPV series from Mitsui). A chemically crosslinked product of any one of the above thermoplastic elastomers also has molding characteristics before chemical curing, and therefore can also be used in the present invention. Such resin is preferably a resin having a high melting point (for example, greater than 50 degrees Celsius). During formation, the resin softens and conforms to a shape, and further curing reaction occurs so that the same is shaped.

The thermoplastic elastomer is preferably made of one or more of thermoplastic polyurethane elastomer, thermoplastic polyester elastomer, and thermoplastic vulcanized ester elastomer. A specific type of the thermoplastic elastomer used in the present invention is not particularly limited as long as the molecule thereof has a chemically crosslinkable structure (including having a crosslinkable group such as unsaturated double bonds, isocyanate, etc., or a structure that can be broken and crosslinked by means of radiation, such as a carbon-hydrogen bond, unsaturated double bonds, etc.). The thermoplastic elastomer used in the present invention may be prepared by a known method according to prior art documents, and may also be commercially purchased. Commercially available thermoplastic polyester elastomer (TPE) products suitable for the present invention include TPC series materials from DSM, such as TPC-EM740, TPC-EM550, and TPC-EM400. TPEE products of HYTREL series from Dupont are also suitable for the present invention, such as HYTREL 5556, HYTREL 6356, HYTREL 7246, and HYTREL 8238. Such polyester elastomer includes a block copolymer consisting of a polybutylene terephthalate (PBT) crystalline hard segment and a long-chain polytetrahydrofuran-based polyether (PTMG) soft segment. Commercially available polyurethane elastomer (TPU) suitable for the present invention includes LPR 9060, LPR2203-93, etc., from COIM, Italy. Such material is preferably a polymer resin having a high melting point. The material can be shaped between 50 degrees and 200 degrees, and molding is completed by means of crystallization and heat shaping. In order to enable the electromagnetic shielding film to have good thermoforming performance and further improved thermal stability, the thermoplastic elastomer forming the electromagnetic shielding film is preferably subjected to chemical crosslinking treatment. A method for subjecting the thermoplastic elastomer to chemical crosslinking treatment is not particularly limited, and conventional physical and chemical methods can be employed, such as electron beam radiation crosslinking, microwave radiation crosslinking, ultraviolet radiation crosslinking, chemical crosslinking, etc. Preferably, the thermoplastic elastomer is cured by means of electron beam radiation crosslinking. The electron beam radiation includes employing an electron beam having electron beam energy of 100 to 300 KV to irradiate the thermoplastic elastomer to an electron beam dose of 3 to 16 Mrad so as to destroy a weak portion in the molecule of the thermoplastic elastomer and cause crosslinking performed by means of chemical bonds.

The thermosetting elastomer is preferably made of materials such as crosslinked thermoplastic polyurethane elastomer, crosslinked thermoplastic polyester elastomer, hot-vulcanized rubber, etc. The crosslinked thermoplastic polyurethane elastomer and the crosslinked thermoplastic polyester elastomer have undergone further chemical crosslinking, and therefore the materials exhibit characteristics of non-melting and non-melting at high temperatures. Therefore, the two are more suitable for application to the present invention. The hot-vulcanized rubber material is more prone to complete formation within a temperature range, and is then further vulcanized at high temperatures to form an insoluble and infusible solid.

The molding layer is in the form of a thin film. Since the spacing between devices is limited, the thin film has a thickness of 5 μm to 100 μm, or 5 μm to 50 μm, or 5 μm to 20 μm.

Conductive Non-Woven Layer

A conductive non-woven layer suitable for the present invention includes a polymer non-woven fiber material and a conductive material, and the polymer non-woven fiber material has a melting point of greater than or equal to 220° C.

The polymer non-woven fiber material includes one or more of a liquid crystal polymer non-woven fiber material and a polyethylene terephthalate non-woven fiber material.

The conductive non-woven material is formed by employing a polymer fiber material as a non-woven fabric base and generating one or more conductive metal layers, such as one or more layers of nickel, copper, silver, gold, etc., on surfaces of polymer fibers by means of electroplating, electroless plating, magnetron sputtering, etc., and therefore the same is conductive. The polymer non-woven fiber material is preferably selected from polymer materials having a melting point of 220° C. or higher so as to ensure thermal stability of a product.

In the present invention, the conductive non-woven material provides shielding and grounding functions. Therefore, a good shielding and grounding effect can be achieved without the need that an adhesive layer contains a relatively high content of conductive particles.

The conductive material in the polymer non-woven fiber material at least partially covers a surface of the polymer non-woven fiber material.

The conductive non-woven layer has a thickness of 10-50 μm, and a plating layer generally has a thickness of 0.5-5 μm.

Adhesive Film

A 3D formed electromagnetic shielding film suitable for the present invention includes an adhesive film. The adhesive film may be a silicone pressure-sensitive adhesive film or a structural adhesive film.

In the 3D formed electromagnetic shielding film of the present invention, the adhesive film and the molding layer are laminated. Before 3D formation, a conductive non-woven shielding layer is partially embedded in the adhesive film. After 3D formation, the conductive non-woven shielding layer is entirely embedded in the adhesive film. The adhesive film can bond the molding layer and the conductive non-woven layer to each other.

According to some preferred embodiments of the present invention, a conductive filler of no more than 40 wt. % may also be added to the adhesive film so as to improve shielding performance and grounding performance of the 3D formed electromagnetic shielding film.

A silicone pressure-sensitive adhesive refers to an adhesive layer using polydimethylsiloxane as a main body and using silicone resin added thereto as tackifying resin, and is generally subjected to peroxide crosslinking. Crosslinking of a silicone pressure-sensitive adhesive containing a vinyl group is mostly achieved by employing a precious metal to catalyze addition of silicon-hydrogen bonds, and in more examples, an electron beam or UV radiation is employed to achieve the crosslinking. In order to further improve temperature resistance of the silicone pressure-sensitive adhesive, employing phenyl-containing polymethylsiloxane is also a common means in the art.

When the adhesive film according to the present invention is a silicone pressure-sensitive adhesive film, the storage modulus of the silicone pressure-sensitive adhesive film at 25° C. and 1 Hz is 40,000-2,000,000 Pa. Good adhesiveness and formablity are exhibited, and the parameters hardly change before and after 3D formation.

When the adhesive film according to the present invention is a structural adhesive film, the structural adhesive film is a cured product of an epoxy resin and a hardener. The epoxy resin includes one or more of phenolic epoxy resin, cresol epoxy resin, epoxy resin containing a dicyclopentadiene structure and derivatives thereof, and epoxy resin containing a 9,9-diphenylfluorene structure and derivatives thereof. The hardener includes one or more of diaminodiphenylsulfone, dicyandiamide, linear phenolic aldehyde, and linear cresol phenolic aldehyde. An epoxy adhesive film is an adhesive layer having a non-adhesive surface prepared by means of solvent solution or hot melt coating of raw materials such as an epoxy resin, a curing agent, an optional promoter, etc.

An adhesive film suitable for the present invention may contain no conductive particle, or may contain a conductive filler less than or equal to 40 wt. % of the total weight of the adhesive film. That is, the electromagnetic shielding film provided in the present invention can achieve shielding or grounding functions without using the conductive filler in the adhesive film. In the present invention, the conductive particles in the adhesive film enhance the shielding and grounding functions of the conductive non-woven layer. The adhesive film does not contain any conductive particle, and can also achieve shielding and grounding functions by means of the conductive non-woven layer. If no conductive non-woven layer exists, then only a conductive filler of no more than 40 wt. % is used in the adhesive film. The electromagnetic shielding film may have a surface resistance exceeding 10 ohms, but the grounding and shielding functions cannot be effectively achieved.

In the 3D formable electromagnetic shielding film provided by the present invention, the conductive non-woven layer is partially embedded in the adhesive film. In the 3D formed electromagnetic shielding film provided by the present invention, the conductive non-woven layer is embedded in the adhesive film. The present invention uses a conductive non-woven layer, and can improve cohesive strength of the electromagnetic shielding film by controlling interpenetration between the adhesive film and the conductive non-woven layer, thereby improving the reliability of the product.

The molding layer can be formed by means of hot pressing to better cause the conductive non-woven layer and the adhesive film to conform to a shape so as to obtain a desired 3D shape. The present invention is particularly suitable for a circuit board having relatively high electronic components and relatively short spacing therebetween. In addition, the molding layer mechanically protects the shielding layer (conductive non-woven layer) on an inner side during wave soldering or reflow soldering. By means of the interpenetration between the conductive non-woven layer and the adhesive film, part of fibers of the conductive non-woven layer are exposed on the surface after hot-press forming so as to provide interconnection to a ground point of a device. In some embodiments of the present invention, an appropriate amount of conductive particles are added to the adhesive film, thereby further improving the grounding performance of the 3D formed electromagnetic shielding film.

The 3D formed electromagnetic shielding film in the present invention includes a laminated structure consisting of a molding layer, an adhesive layer, and a conductive non-woven layer. The laminated structure can be prepared by independently preparing single material layers and then performing bonding (at an appropriate temperature and pressure). Coating may also be employed, wherein the molding layer is coated with the adhesive layer, and bonding to the non-woven fabric layer is performed. Coating may also be performed on the non-woven fabric, wherein a penetration quantity of an adhesive tape is controlled, and bonding to the molding layer is performed.

The present invention further provides a method for preparing a 3D formed electromagnetic shielding film, wherein the 3D formable electromagnetic shielding film according to any one of embodiments of the present invention is attached to a circuit board, and 3D formation is performed to obtain a 3D formed electromagnetic shielding film. A method for the 3D formation includes any one of mold clamping, blowing, vacuum molding, etc.

Hot-press and mold clamping forming refers to preparing a mold having the same recess shape as electronic components, placing an electromagnetic shielding film pre-heated to a forming temperature horizontally on a surface layer of the electronic component, and pressing the electromagnetic shielding film into a recess between the electronic components by heating the mold.

Blow forming refers to employing high-temperature and high-pressure gas, placing an electromagnetic shielding film pre-heated to a forming temperature horizontally on a surface layer of an electronic component and injecting the high-pressure gas into a mold cavity to perform pressurization so as to complete the forming.

Vacuum forming refers to punching a gas hole at a connection between electronic components and then applying vacuum suction in a reverse direction to form a pre-heated electromagnetic shielding film on a device.

If an epoxy adhesive film is employed, then the formed 3D formed electromagnetic shielding film needs to be further cured at high temperatures so as to obtain a final product.

EXAMPLES

In the present invention, unless otherwise pointed out, the reagents employed are all commercially available products, which are directly used without further purification.

| Chemical Name | Product Name | Supplier or Manufacturer |
| --- | --- | --- |
| PEEK thin film | APTIV 2000 | Victrex (U.K.) |
| Thermoplastic polyester | Hytrel 7246 | Dupont (U.S.) |
| Thermoplastic polyurethane | LARIPUR LPR 9060 | Coim (Italy) |
| Silicone pressure-sensitive adhesive | PSA6574 | Momentive (U.S.) |
| BPO crosslinking agent | Luperox A75 | Sigma Aldrich (China) |
| Dicyclopentadiene epoxy resin | 7200L | DIC, Japan |
| Dicyclopentadiene epoxy resin | 7200H | DIC, Japan |
| O-cresol epoxy resin | NPCN - 702H | Nanya Electronic Materials (Kunshan) Co., Ltd. |
| Phenolic resin | BRG-557 | AICA, Japan |
| Phenolic resin | NPEH - 710 | Nanya Electronic Materials (Kunshan) Co., Ltd. |
| Dicyandiamide | DICY DDA5 | Shenzhen Jiadida New Material Technology Co., Ltd. |
| Diaminodiphenylsulfone | DDS hansort-1445 | Tianjin Haohe Technology Development Co., Ltd. |
| Diaminodiphenylmethane | DDM | SINOPHARM |
| 2-methyl-4-ethylimidazole | 2M4MZ | SINOPHARM |
| 2,4-diamino-6-[2-(2-methyl-1-imidazolyl)ethyl]-1,3,5-thiazine | 2MZ-A | Shikoku Chemicals Corporation, Japan |
| Nickel powder | D90 10 μm | Shanghai Jiaxin Purification Device Co., Ltd. |
| Silver-coated copper powder | FCC-2000 | Fukuda Sangyo, Japan |
| Conductive non-woven fabric | LCP conductive non-woven fabric WA35C | Zhejiang Saintyear Electronics |
| Conductive non-woven fabric | PET conductive non-woven fabric WF37B | Zhejiang Saintyear Electronics |
| Conductive non-woven fabric | PET conductive non-woven fabric WR36C | Zhejiang Saintyear Electronics |

Test Method
Surface Resistance

Figure 4:
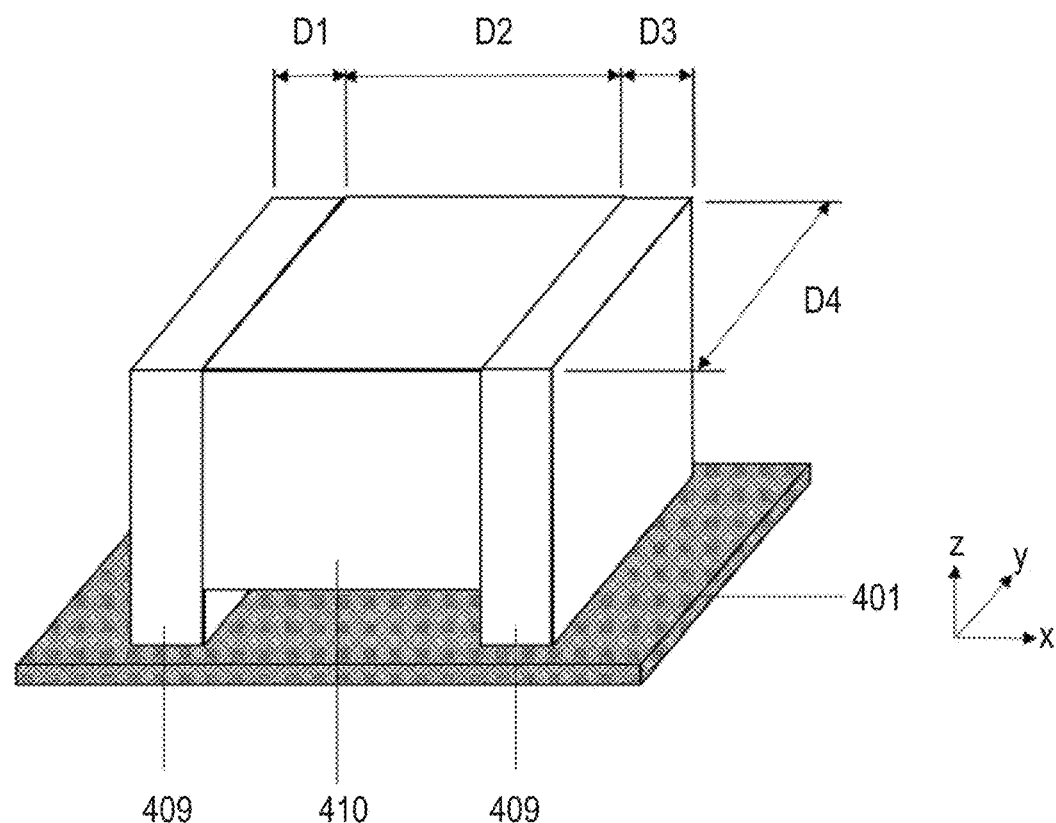
FIG. 4 is a test fixture for testing a surface resistance of an electromagnetic shielding film according to the present invention.

A test fixture and dimensions are shown in FIG. 4. The test fixture has a total weight of 250 g. 25.4 mm×5 mm gold-plated conductive blocks are provided on two sides thereof, and an insulating plastic block is provided in the middle thereof. A 25.4 mm electromagnetic shielding film with a molding layer facing downwards and an adhesive layer facing upwards is prepared. The test fixture shown in the figure is placed on the electromagnetic shielding film. As shown in FIG. 4, 401 is an electromagnetic shielding film; 409 is a gold-plated conductive block; 410 is an insulating plastic block; D1 is the length of the gold-plated conductive block on the x-axis; D2 is the perpendicular distance between two gold-plated conductive blocks parallel to each other; D3 is the thickness of the insulating plastic block; and D4 is the length of the gold-plated conductive block on the y-axis. Subsequently, a direct current is applied; after 15 seconds, a direct current resistance is recorded, and a resistance value is recorded every 5 seconds from 15 to 60 seconds; an average value of the recorded resistance values is calculated and is denoted as a surface resistance.

Dynamic Mechanical Analysis (DMA) Curve

Respective rheological curve characteristics of the electromagnetic shielding film samples prepared in embodiments 1-4 are separately measured by the following means to determine a degree of change in a loss factor thereof.

Specifically, DMA Q800 produced by TA Corporation of the United States is employed, and a tensile mode is employed. The sample is prepared to be 10 mm×5 mm, and is held by a tensile fixture. Subsequently, under the circumstance where a temperature ramp rate is 5° C./min and a test frequency is 1 Hz, rheological measurement is performed at different temperatures to obtain a storage modulus G' and a loss modulus G", and a loss factor value (i.e., a damping value) tan δ is calculated from the storage modulus G' and the loss modulus G" according to the following formula:

$$\tan \delta = G''/G'.$$

Rheological Curve

Respective rheological curve characteristics of the silicone pressure-sensitive adhesives of the electromagnetic shielding film samples prepared in embodiments 1-4 are separately measured by the following means to determine a degree of change in damping properties thereof.

Specifically, an Ares G2 rotary rheometer produced by TA Corporation of the United States is employed to measure the rheological curve. First, pressure-sensitive adhesive film samples having a thickness of 1 mm are held by 8-inch parallel plate fixtures. Subsequently, under the circumstance where the temperature ramp rate is 5° C./min, the test frequency is 1 Hz, and the strain is less than or equal to 1%, rheological measurement is performed at different temperatures to obtain a storage modulus G' and a loss modulus G", and a loss factor value (i.e., a damping value) tan δ is calculated from the storage modulus G' and the loss modulus G" according to the following formula:

$$\tan \delta = G''/G'.$$

EXAMPLES

Embodiment 1

500 g of silicone pressure-sensitive adhesive PSA6574 was taken; toluene was used to dilute a solid content to 30%; 7.5 g of Luperox A75 (Sigma-Aldrich) was added; a slit extrusion coating method was employed to coat a release film (fluoroplastic release film, Siliconature 1R82001) with an adhesive film having a thickness of 10 μm; curing was performed at 150° C. in a drying oven for 2 min; then, a 15 μm conductive non-woven fabric and a 9 μm APTIV 2000 PEEK thin film were separately thermally attached to an adhesive surface of the adhesive film, wherein the temperature was 80° C. and the pressure is 1 MPa. Then, a 3D formable electromagnetic shielding film was obtained.

| Structure | Material | Supplier | Thickness |
|---|---|---|---|
| Thermoplastic layer | PEEK APTV2000 thin film | Victrex | 9 μm |
| Conductive non-woven fabric | Nickel-plated copper-plated LCP conductive non-woven fabric | Zhejiang Saintyear Electronics | 15 μm |
| Adhesive layer | Silicone pressure-sensitive adhesive, PSA6574 | Momentive | 10 μm |

A DMA tensile mode was employed to measure the 3D formable electromagnetic shielding film, wherein the fixed frequency was 1 Hz, heating was performed from 25-250° C., and the temperature ramp rate was 5° C./min. In the curve, tan δ>0.5 in an interval of 135-180° C.; a maximum value occurred at 150° C., and corresponding tan δ was 1.8.

Figure 3:
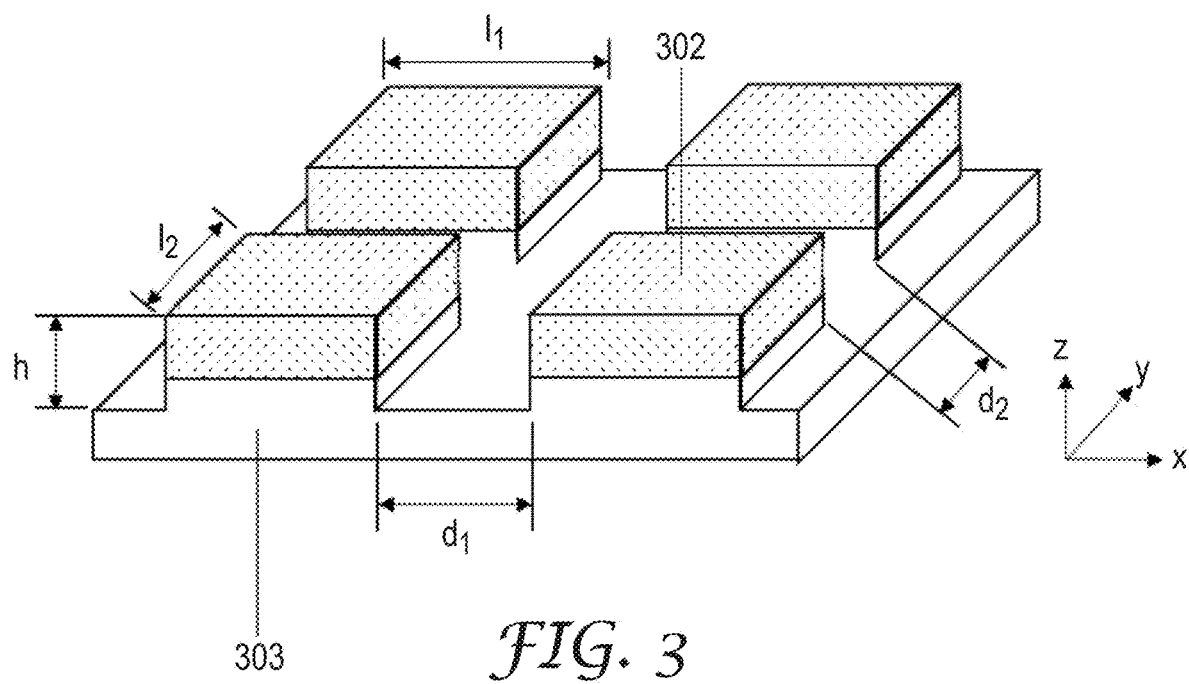
FIG. 3 is a schematic structural diagram of a system-in-package device according to the present invention, where 302 is an SIP device; 303 is a circuit board; the length of the SIP device in the x-axis direction is $l_1$, the width of the SIP device in the y-axis direction is $l_2$, and the height of the SIP device is h; the spacing between two adjacent devices is $d_1$ in the x-axis direction and $d_2$ in the y-axis direction.

The 3D formable electromagnetic shielding film can be formed by means of hot pressing; for example, the same was formed by means of blowing at a temperature of 150° C., and a good 3D shape can be obtained. The 3D formable electromagnetic shielding film was covered on an electronic device (as shown in FIG. 3) of a circuit board. The hot-pressed thin film was formed at 150° C.; then, heating was continued to reach 180° C. for 30 s, and cooling was performed to reach 50° C. so as to perform mold opening. The APTV2000 thin film underwent further crystalline transition, and the DMA tensile mode was employed to measure a formed 3D formed electromagnetic shielding film, wherein the fixed frequency was 1 Hz, heating was performed from 150-250° C., and the temperature ramp rate was 5° C./min. In a temperature range of 180-250° C., tan δ was always less than 0.2. A maximum value of tan δ occurred at 250° C., and was 0.14. A surface resistance was tested to be 150 mΩ.

The device structure employed in embodiment 1 is shown in FIG. 3, and corresponding dimensions are shown in the following table. A ratio of a surface area $S_2$ after forming to a surface area $S_1$ before forming was 2.9697.

| | |
|---|---|
| $l_1$ | 40000 μm |
| $l_2$ | 25000 μm |
| h | 1000 μm |
| $d_1$ | 1000 μm |
| $d_2$ | 1000 μm |
| $S_2/S_1$ | 2.9697 |

*The above measurement values may be measured by means of laser-based 3D scanning, and may also be measured by embedding the sample in a resin, slicing the same, and then performing measurement under a microscope.

Embodiment 2

Epoxy resin DIC 7200HH was dissolved in butanone, at a solid content of 70%. Linear phenolic resin AICA BRG-557 was dissolved in butanone, at a solid content of 70%. 100 g of a dissolved DIC 7200HH resin solution and 30 g of an AICA BRG-557 resin solution were well mixed, then 3 g of 2M4Z was added; 2M4Z dissolved so that the solution became clear and transparent. A 10 μm conductive PET non-woven fabric was coated with an epoxy adhesive by means of slit extrusion coating, and a solvent was dried at 90° C. The obtained conductive non-woven fabric having the adhesive had a total thickness of 12 μm, and then a 9 μm PEEK APTIV2000 PEEK thin film was thermally attached to the conductive non-woven fabric having the adhesive. Then a 3D formable electromagnetic shielding film was obtained.

A DMA tensile mode was employed to measure the 3D formable electromagnetic shielding film, wherein the fixed frequency was 1 Hz, heating was performed from 25-250° C., and the temperature ramp rate was 5° C./min. In the curve, tan δ>0.5 in an interval of 80-180° C.; a maximum value occurred at 130° C., and corresponding tan δ was 2.4.

The 3D formable electromagnetic shielding film was attached to a circuit board, and can be formed by means of hot pressing; for example, the same was formed by means of mold clamping at a temperature of 150° C., and a good 3D shape matching an electronic component on the circuit board can be obtained. The thin film was formed at 150° C.; then, heating was continued to reach 180° C. for 10 min, and cooling was performed to reach 50° C. so as to perform mold opening. An obtained product was further placed in a drying oven, and was subjected to further curing at 120° C. for 30 min so as to obtain a formed electromagnetic shielding film. The DMA tensile mode was employed to perform measurement, wherein the fixed frequency was 1 Hz, heating was performed from 150-250° C., and the temperature ramp rate was 5° C./min. In a temperature range of 180-250° C., tan δ was always less than 0.2. A maximum value of tan δ occurred at 220° C., and was 0.05. A surface resistance was tested to be 500 mΩ.

The device structure employed in embodiment 2 is shown in FIG. 3, and corresponding dimensions are shown in the following table. A ratio of a surface area $S_2$ after forming to a surface area $S_1$ before forming was 10.8684.

| | |
|---|---|
| $l_1$ | 10000 μm |
| $l_2$ | 5000 μm |
| h | 1000 μm |
| $d_1$ | 200 μm |
| $d_2$ | 200 μm |
| $S_2/S_1$ | 10.8684 |

The structure of another device employed in embodiment 2 is also shown in FIG. 3, and corresponding dimensions are shown in the following table. The ratio of a surface area $S_2$ after forming to a surface area $S_1$ before forming was 8.8843.

| | |
|---|---|
| $l_1$ | 5000 μm |
| $l_2$ | 5000 μm |
| h | 800 μm |
| $d_1$ | 200 μm |
| $d_2$ | 200 μm |
| $S_2/S_1$ | 8.8843 |

Embodiment 3

Dupont Hytrel 7246 particles were employed to prepare a 10 μm thermoplastic polyester elastomer thin film by means of a casting and tension process, and then crosslinking employing 180 KV 9 Mrad electron beam radiation was performed so as to obtain a crosslinked thermoplastic polyester elastomer thin film.

Epoxy resin NPCN 702H was dissolved in butanone, at a solid content of 70%. Linear phenolic resin NPEH 710 was dissolved in butanone, at a solid content of 70%. 100 g of a dissolved NPCN 702H resin solution and 25 g of an NPEH 710 resin solution were well mixed, then 3 g of 2MZ-A was added; 2MZ-A dissolved so that the solution became clear and transparent, and then 5 g of nickel powder having a particle size D90 of 10 μm was added. A 10 μm conductive PET non-woven fabric was coated with an adhesive by means of wire rod coating, and a solvent was dried at 90° C. The obtained conductive non-woven fabric having the adhesive had a total thickness of 12 μm, and then a self-manufactured crosslinked thermoplastic polyester elastomer thin film having a thickness of 10 μm was thermally attached to the conductive non-woven fabric having the adhesive. Then a 3D formable electromagnetic shielding film was obtained.

A DMA tensile mode was employed to measure the 3D formable electromagnetic shielding film, wherein the fixed frequency was 1 Hz, heating was performed from 25-250° C., and the temperature ramp rate was 5° C./min. In the curve, tan δ>0.5 in an interval of 80-180° C.; a maximum value occurred at 120° C., and corresponding tan δ was 2.2.

The 3D formable electromagnetic shielding film can be formed by means of hot pressing; for example, the same was formed by means of mold clamping at a temperature of 120° C., and a good 3D shape can be obtained. The thin film was formed at 120° C. and the temperature was maintained for 10 min, and cooling was performed to reach 50° C. so as to perform mold opening. An obtained product was further placed in a drying oven, and was subjected to further curing at 120 degrees for 30 min so as to obtain a formed electromagnetic shielding film. The DMA tensile mode was employed to perform measurement, wherein the fixed frequency was 1 Hz, heating was performed from 150-250° C., and the temperature ramp rate was 5° C./min. In a temperature range of 180-250° C., tan δ was always less than 0.2. A maximum value of tan δ occurred at 220° C., and was 0.05. A surface resistance was tested to be 200 mΩ.

The device structure employed in embodiment 3 is also shown in FIG. 3, and corresponding dimensions are shown in the following table. A ratio of a surface area $S_2$ after forming to a surface area $S_1$ before forming was 4.0896.

| | |
|---|---|
| $l_1$ | 16000 μm |
| $l_2$ | 12000 μm |
| h | 1600 μm |
| $d_1$ | 1000 μm |
| $d_2$ | 1000 μm |
| $S_2/S_1$ | 4.0896 |

Embodiment 4

Coim LPR 9060 particles were employed to prepare a 15 μm thin film by means of a casting and tension process, and then crosslinking employing 180 KV 16 Mrad electron beam radiation was performed so as to obtain a crosslinked thermoplastic polyurethane elastomer thin film.

Epoxy resin DIC 7200 was dissolved in butanone, at a solid content of 70%. 100 g of a dissolved Nanya NPCN 702H resin solution was taken, 8 g of dicyandiamide (DDA 5, Jiadida) was added, and the mixture was well mixed; 10 g of silver-coated copper powder having a particle size of 5 μm was added, and was dispersed evenly. The 15 μm self-manufactured crosslinked thermoplastic polyurethane elastomer thin film was coated with an adhesive by means of wire rod coating, and then a 10 μm conductive PET non-woven fabric was attached to a side of an uncured adhesive layer so as to obtain a 3D formable electromagnetic shielding film.

A DMA tensile mode was employed to measure the 3D formable electromagnetic shielding film, wherein the fixed frequency was 1 Hz, heating was performed from 25-250° C., and the temperature ramp rate was 5° C./min. In the curve, tan δ>0.5 in an interval of 80-180° C.; a maximum value occurred at 100° C., and corresponding tan δ was 2.5.

The 3D formable electromagnetic shielding film can be formed by means of hot pressing; for example, the same was formed by means of mold clamping at a temperature of 120° C., and a good 3D shape can be obtained. The thin film was formed at 120° C. and the temperature was maintained for 10 min, and cooling was performed to reach 50° C. so as to perform mold opening. An obtained product was further placed in a drying oven, and was subjected to further curing at 120° C. for 30 min so as to obtain a formed electromagnetic shielding film. The DMA tensile mode was employed to perform measurement, wherein the fixed frequency was 1 Hz, heating was performed from 150-250° C., and the temperature ramp rate was 5° C./min. In a temperature range of 180-250° C., tan δ was always less than 0.2. A maximum value of tan δ occurred at 180° C., and was 0.17. A surface resistance was tested to be 300 mΩ.

The device structure employed in embodiment 4 is shown in FIG. 3, and corresponding dimensions are shown in the following table. A ratio of a surface area $S_2$ after forming to a surface area $S_1$ before forming was 4.0896.

| | |
|---|---|
| $l_1$ | 16000 μm |
| $l_2$ | 12000 μm |
| h | 1600 μm |
| $d_1$ | 1000 μm |
| $d_2$ | 1000 μm |
| $S_2/S_1$ | 4.0896 |

Although particular embodiments have been shown and described in the present invention, a person skilled in the art will understand that various alternative and/or equivalent embodiments can be used in place of the particular embodiments shown and described without departing from the scope of the present invention. The present application intends to include any improvement or modification for the specific embodiments discussed in the present invention. Accordingly, the present invention is subjected only to the claims and equivalents thereof.

It should be understood by a person skilled in the art that, various modifications and changes can be made without departing from the scope of the invention. Such modifications and changes are intended to fall within the scope of the invention as defined in the appended claims.

What is claimed is:

1. A circuit board to which a 3D formed electromagnetic shielding film is attached, the circuit board comprising an electronic component, wherein the 3D formed electromagnetic shielding film comprises a molding layer, a shielding layer, and an adhesive film; the molding layer and the adhesive film are laminated; the shielding layer is a conductive non-woven layer embedded in the adhesive film, wherein a ratio of a surface area S2 of the electromagnetic shielding film after forming with an upper surface area of the electronic component deducted to a surface area $S_1$ thereof before forming with the upper surface area of the electronic component deducted is 1.5 to 17, and the electromagnetic shielding film has a surface resistance of less than or equal to 10 Ω and a loss factor value tan δ of less than or equal to 0.2 in the temperature range of 180-250° C.

2. The circuit board according to claim 1, wherein the conductive non-woven layer comprises a polymer non-woven fiber material and a conductive material, and the polymer non-woven fiber material has a melting point of greater than or equal to 220° C.

3. The circuit board according to claim 2, wherein the polymer non-woven fiber material comprises at least one of a liquid crystal polymer non-woven fiber material and a polyethylene terephthalate non-woven fiber material.

4. The circuit board according to claim 1, wherein the molding layer comprises a molded and shaped product of one or more of a thermoplastic plastic, a thermosetting plastic, a thermoplastic elastomer, and a thermosetting elastomer.

* * * * *

UNITED STATES PATENT AND TRADEMARK OFFICE
CERTIFICATE OF CORRECTION

| | | |
|---|---|---|
| PATENT NO. | : 12,245,411 B2 | Page 1 of 1 |
| APPLICATION NO. | : 18/265597 | |
| DATED | : March 4, 2025 | |
| INVENTOR(S) | : Chao Yang | |

It is certified that error appears in the above-identified patent and that said Letters Patent is hereby corrected as shown below:

In the Claims

<u>Column 16</u>
Line 11, In Claim 1, delete "surface area S2" and insert -- surface area $S_2$ --, therefor.

Signed and Sealed this
Sixteenth Day of September, 2025

Coke Morgan Stewart
*Acting Director of the United States Patent and Trademark Office*